United States Patent [19]
O'Brien et al.

[11] Patent Number: 5,270,870
[45] Date of Patent: Dec. 14, 1993

[54] ATHERMALIZED BEAM SOURCE AND COLLIMATOR LENS ASSEMBLY

[75] Inventors: Michael J. O'Brien; William B. Smith, both of Rochester, N.Y.

[73] Assignee: Eastman Kodak Company, Rochester, N.Y.

[21] Appl. No.: 996,225

[22] Filed: Dec. 23, 1992

[51] Int. Cl.⁵ .................................................. G02B 7/02
[52] U.S. Cl. ..................................... 359/820; 359/641; 385/33; 372/36
[58] Field of Search ............... 359/823, 819, 820, 641; 385/32, 33; 372/36

[56] References Cited

U.S. PATENT DOCUMENTS

| | | | |
|---|---|---|---|
| 4,525,745 | 6/1985 | Ghaem-Maghami et al. | 358/237 |
| 4,604,753 | 8/1986 | Sawai | 372/36 |
| 4,656,635 | 4/1987 | Baer et al. | 372/69 |
| 4,693,555 | 9/1987 | Arai et al. | 359/820 |
| 4,697,880 | 10/1987 | Angerstein et al. | 359/823 |
| 4,730,335 | 3/1988 | Clark et al. | 372/98 |
| 4,850,674 | 7/1989 | Hasselskog | 359/820 |
| 4,861,137 | 8/1989 | Nagata | 359/820 |
| 4,993,801 | 2/1991 | Sarraf | 359/641 |

FOREIGN PATENT DOCUMENTS

| | | | |
|---|---|---|---|
| 2830341 | 7/1978 | Fed. Rep. of Germany . | |
| 58-203405 | 11/1983 | Japan | 359/820 |
| 0015206 | 1/1984 | Japan | 359/830 |
| 127800 | 3/1919 | United Kingdom . | |
| 1325936 | 12/1919 | United Kingdom | 359/820 |

Primary Examiner—Loha Ben
Attorney, Agent, or Firm—Thomas H. Close; Mark Z. Dudley

[57] ABSTRACT

An athermalized beam source and collimator assembly includes a collimator lens spaced from a novel circular foldback flexure plate by a lens barrel. The circular foldback flexure plate incorporates a circular foldback flexure adjacent the beam source mount to isolate the beam source from the ambient environment and to athermalize the assembly. The beam source mount and circular foldback flexure plate are composed of a material that is identical in composition and CTE as the portion of the beam source that is attached to the beam source mount. The temperature of the beam source may then be maintained by a thermal element mounted to the back surface of the flexure plate, without the occurrence of mechanical strain at the interface between the beam source and beam source mount.

16 Claims, 4 Drawing Sheets

ATHERMALIZED BEAM SOURCE AND COLLIMATOR LENS ASSEMBLY

BACKGROUND OF THE INVENTION

The present invention relates to means for effecting temperature-compensation of focal length in an optical assembly.

Certain optical assemblies such as those found in laser beam output scanners require a stable monochromatic collimated light beam provided by a beam source, such as a laser diode, and a collimating lens. For adequate optical performance, the beam source must maintain a predetermined beam quality over a wide ambient temperature range. The relative position between the collimating lens and beam source, known as the back focal length, must be maintained over a substantial range of ambient temperature variation. The allowable variance of this back focal length depends on the resolution of the scanner. The successful implementation of a very high resolution (e.g., 1,000 dpi) laser beam output scanner may, for example, tolerate no more than 20 microinches of back focal length deviation.

In conventional approaches to the problem, the beam source and lens are mounted in a mechanical structure that attempts to maintain the back focal length while the apparatus undergoes temperature-induced structural changes. Hence, the athermalization (i.e., thermal compensation) of the beam source is effected either passively or actively.

Passive compensation systems typically rely on the differences in coefficients of thermal expansions of the various elements in the optical system such that there is minimal net focus shift with temperature. The conventional approach is to employ concentric tube systems, which, if constructed from common materials, are too large or bulky. For example, U.S. Pat. No. 4,730,335 discloses a series of interlocking tubes each carrying a single optical element of an optically-pumped solid-state laser. However, the accuracy of a passive system will depend upon the CTE of the materials chosen for the construction of certain components of the system. Thus, some passive designs cannot be manufactured because the desired CTE is simply not exhibited by the materials suited for fabricating the requisite system components, or because the desired CTE is available but only in materials that are unstable, thus rendering a system response that is inaccurate, unstable, or unreliable.

Active compensation systems typically rely on active temperature control of the beam source such that the beam source temperature is made constant. For example, a thermoelectric cooler is employed in the apparatus disclosed in U.S. Pat. No. 4,604,753 to stabilize the output power and wavelength of a laser diode beam source; U.S. Pat. Nos. 4,656,635 and 4,993,801 disclose a beam source wherein a thermoelectric cooler is employed to control the operating temperature of the entire optical head. However, as will be described below, conventional active athermalization approaches have been found less than desirable.

SUMMARY OF THE INVENTION

We have found that the athermalization provided in the majority of conventional active athermalization approaches will nonetheless allow the beam source to experience some relative motion that precludes its application to the aforementioned very high resolution output beam scanner. In particular, we have found that the beam source will deform, or "bow", away from the surface of the beam source mounting block when the thermoelectric cooler is active. This movement is due to the fact that the beam source and mounting block are typically formed of materials having dissimilar coefficients of thermal expansion (CTE), and while the thermoelectric cooler is active, a high thermal gradient occurs at the beam source/mounting block interface, thus causing a undesired mechanical strain therein.

Accordingly, an athermalized beam source and collimator assembly may be constructed according to the present invention to include a collimator lens spaced from a novel circular foldback flexure plate by a barrel element. The circular foldback flexure plate incorporates a circular foldback flexure adjacent the beam source mount to isolate the beam source from the ambient environment and to athermalize the assembly. The beam source mount and circular foldback flexure plate can thereby be composed of a material (such as copper) that is identical in composition and CTE as the portion of the beam source that is attached to the beam source mount. The temperature of the beam source may then be maintained by a thermal element mounted to the back surface of the flexure plate, without the occurrence of the above-described bowing effect. A preferred embodiment of an athermalized beam source and collimator assembly has been constructed to maintain the back focal length to within 20 microinches over a large ambient temperature variation.

These and other aspects, objects, features and advantages of the present invention will be more clearly understood and appreciated from a review of the following detailed description of the preferred embodiments and appended claims, and be reference to the accompanying drawings.

DETAILED DESCRIPTION OF THE PREFERRED EMBODIMENTS

Figure 1:
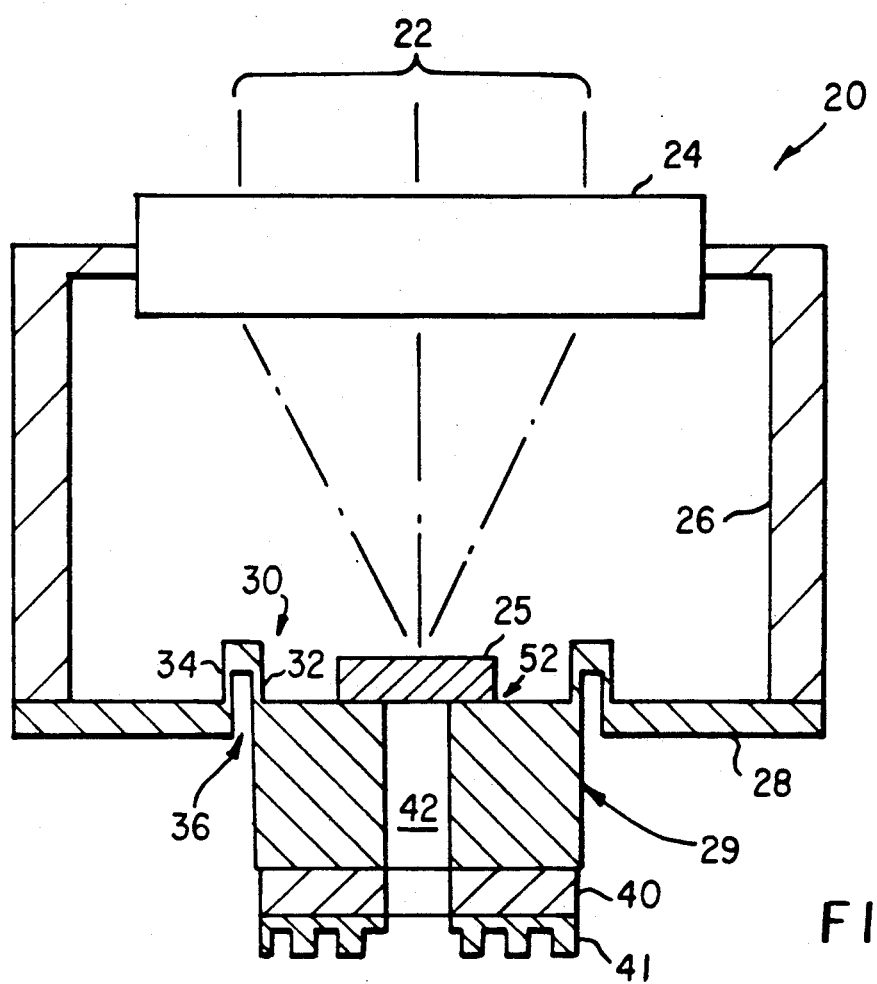
FIG. 1 is a simplified side sectional view of an optical assembly constructed according to the present invention.

Preferred embodiments of the present invention will now be described with reference to the accompanying drawings, wherein like reference numerals refer to like components.

As shown in FIG. 1, a preferred embodiment of the present invention may be constructed as an athermalized optical assembly 20 for use in providing a collimated light beam 22 of essentially constant quality over a wide range of operating temperature. A collimating lens 24, located in the lens barrel 26, is aligned with the optical axis of the light beam 22 from a beam source 25. The beam source 25 is preferably in the form of a semiconductor laser diode fixed in a beam source mount 29 that is integral with the flexure plate 28. Radial and angular alignment of the lens 24 to the beam source 25 is maintained due to the cylindrical geometry of the combination of the flexure plate 28 and lens barrel 26. A kinematic hinge, preferably in the form of a circular foldback flexure 30, includes hinge side walls 32, 34 that define a circular notch 36. The circular foldback flexure 30 is also integral with the flexure plate such that it is situated immediately adjacent the outermost radius of the beam source mount 29. The circular foldback flexure 30 is configured in a fashion sufficient to allow localized deformation at the flexure plate as will be described in greater detail below.

The beam source mount and thus the beam source 25 together are cooled by a thermal element, preferably in the form of a thermo-electric cooler (TEC) module 40 and heat sink 41 to maintain the beam source at a constant temperature for optimum performance. The thermal element is mounted to the back surface of the beam source mount 29. The thermal element includes a central passage 42 for the provision of appropriate power and control signal conductors (not shown) to the beam source 25.

The beam source mount and circular foldback flexure plate are preferably composed of a one material (such as copper) that is identical or substantially similar in composition and CTE to the material that forms the portion of the beam source that is attached to the beam source mount. Preferably, the flexure plate 28, circular foldback flexure 30, and beam source mount 29 are cold formed from single copper plug in a manufacturing process known as upsetting. Alternatively, for some applications, an injection molded plastic could be used, depending upon the thermal conductivity that may be required between the beam source mount and the thermal element.

A preferred beam source 25 is a laser diode commercially available as the Hitachi Model HL7806G laser diode. The thermal element 40 is preferably a thermo-electric cooler (TEC) module 40 commercially available as the Marlow Industries Model SD1507 (modified to include a center hole for wire routing) is clamped between the beam source mount 29 and a black anodized aluminum radial fin heat sink 41. The collimating lens 24 is preferably a lens commercially available from Eastman Kodak Company as the Model Q-28 collimating lens. With the exception of the particular teachings herein, the assembly 20 is contemplated as being manufactured, aligned, and focussed according to optical techniques known in the art.

Figure 2:
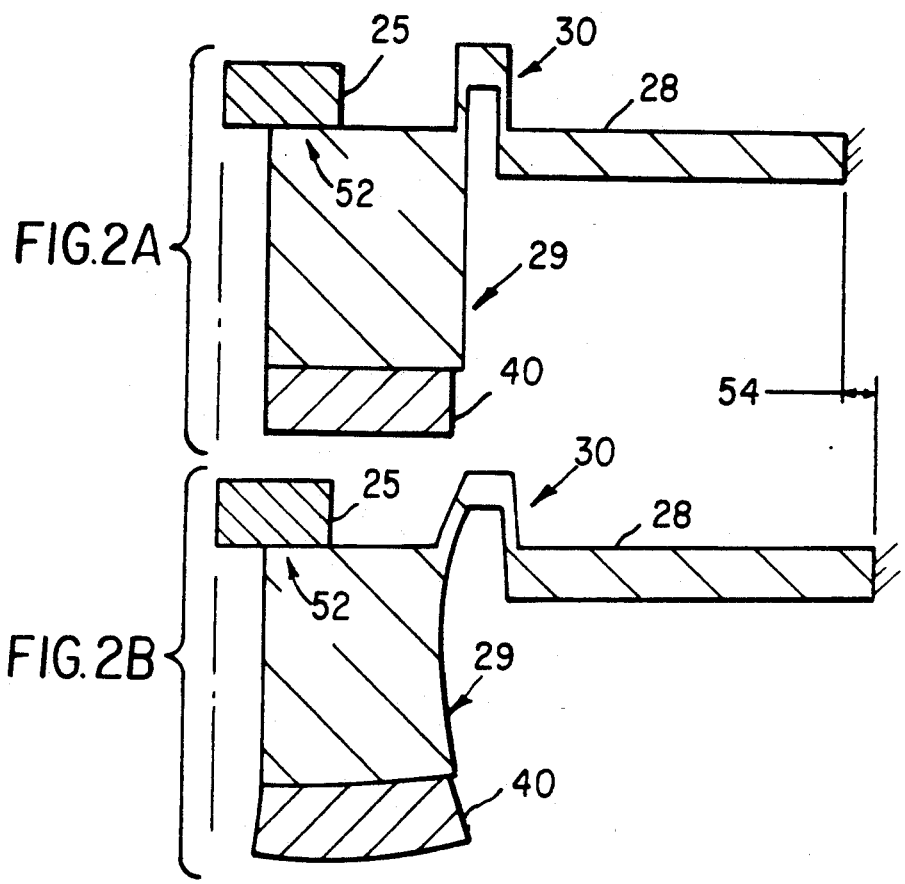
FIGS. 2A and 2B are side sectional, diagrammatic representations of a portion of the assembly of FIG. 1, illustrating the change in focal distance of the assembly of FIG. 1 according to respectively different ambient temperatures.
Figure 3:
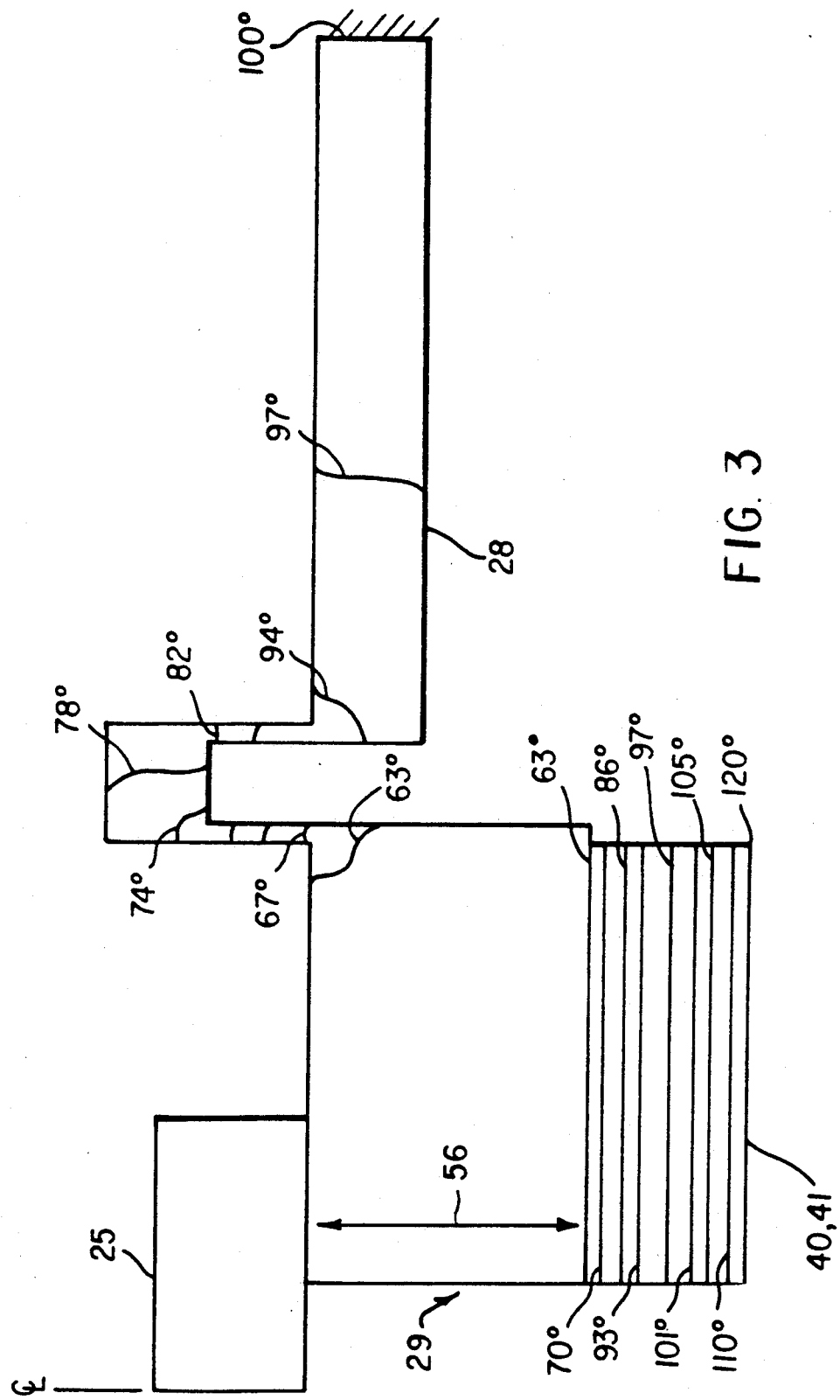
FIG. 3 is a side sectional, diagrammatic representation of the thermal gradients occurring in the assembly portion illustrated in FIG. 2B.

As will now be appreciated with reference to FIGS. 2A, 2B, and 3, it is a particular feature of the present invention that the circular foldback flexure 30 is intended to deform such that only a predetermined amount of controlled motion of the lens 36, along the beam axis, is possible. The primary purposes of the flexure plate 28, according to a particular aspect of the operation of the circular foldback flexure 30, are to maintain the radial alignment of the beam source 25, minimize its vertical displacement, and minimize the mechanical strain at the interface 52 between the beam source 25 and beam source mount 29. This controlled deformation prevents "bowing" at the interface 52 of the beam source and beam source mount so as to preclude the back focal length shift that would otherwise occur. Only a very small, predetermined amount of lens axial motion is allowed to compensate for expansion of the lens barrel 26 and the focal shift of the lens 24.

A finite element model of the system was analyzed to determine the axial motion of the beam source 25. The corresponding deformed displacement of the flexure plate is shown in FIGS. 2A and 2B, and the steady-state temperature profile is shown in FIGS. 3 (only a portion of the assembly 20 is shown in these Figures for clarity; however, as the assembly 20 is radially symmetrical about the beam axis, the illustration is representative of the remainder of the assembly). FIG. 2A shows the configuration of the flexure plate 28 when the beam source 25 is inactive (and thus the assembly temperature is uniformly matched to a nominal ambient temperature of 65° F.). After the beam source and thermal element is activated, and the assembly reaches equilibrium at an ambient temperature of 100° F., a thermally-induced radial deformation 54 occurs in the lens barrel 26 and in the foldback flexure 30.

The temperature distribution is illustrated in FIG. 2 for an ambient temperature 100° F. while the thermal element is assumed to maintain the beam source mount (and the beam source) at a constant 63° F. The high temperature gradient across the thermal element 29 causes fairly large deformations which (advantageously) are not coupled to the beam source mount if the mount depth 56 is sufficiently large. Also, in accordance with another feature of the present invention, the thermal gradient is nearly equal across each flexure section 32, 34, causing equal thermal strains of those sections. Mechanical strains due to expansion are also equal in each flexure section, and consequently the beam source remains centered exactly on the center line CL of the assembly, thereby confining the desired beam axis similarly to the center line.

Figure 4:
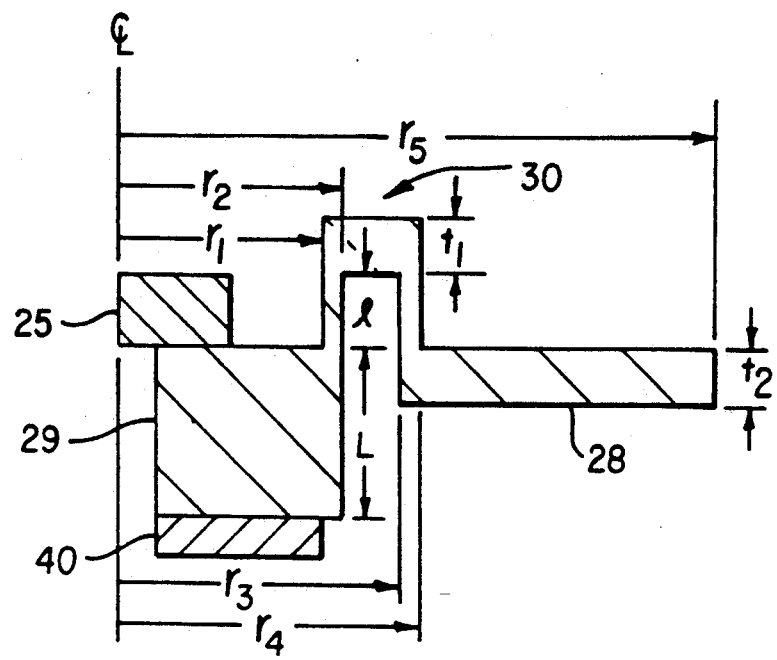
FIG. 4 is a simplified diagrammatic model useful in the analysis of the operation of the assembly of FIG. 1.
Figure 5:
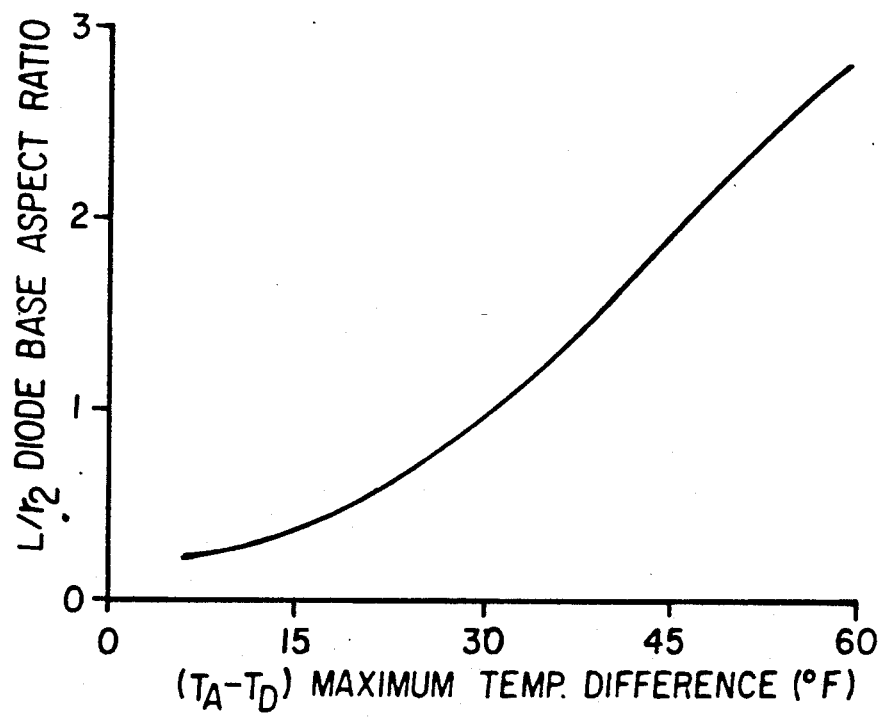
FIG. 5 is a graphical representation of the change in beam source base aspect ratio according to changes in the maximum difference between the beam source temperature and the ambient temperature.

Important dimensions for controlling the thermo/mechanical operation of the assembly 20 are illustrated in FIG. 4. The parameters shown in FIG. 4 and the material properties of the flexure plate determine the thermal resistance between the beam source and the ambient environment. The degree of kinematic movement of the circular foldback flexure 30 can be controlled by several factors, as will not be discussed. The profiles of the inner and outer flexure sections 32, 34 are selected according to the desired amount of translational motion of the beam source. Because the stiffness of the flexure plate 28 at the hinge point (notch 36) is very low compared to the stiffness of the bulk material in the remainder of the flexure plate, kinematic bending moment occurs primarily at the circular foldback flexure. In order to minimize strain at the interface 52 of the beam source mount and the beam source, the beam source mount is configured to have an aspect ratio (i.e., $L/r_2$) that is preferably chosen from the relationship illustrated in FIG. 5, according to the maximum temperature difference between the ambient temperature ($T_A$) and the beam source temperature ($T_D$).

The length L of the beam source mount (the amount situated between the thermal element and the beam source) should be sufficient to integrate the temperature variations of the thermal element and to decouple the thermal strains of the beam source mount from the beam source. Generally, the length L of the beam source mount is determined by the physical space allotted to the assembly 20 according to its particular application. Once L is set, the beam source mount radius ($r_2$) can be determined. The value of $r_3$ is selectable according to manufacturing constraints or the available space requirements. Values for $r_5$, $t_1$, and $t_2$ are also chosen on the same basis.

The geometry of the beam source mount is then calculated according to the equations [1]-[4] listed below. To insure that the thermal strains are equal in the flexure sections, equation [1] is first applied. A value for the foldback flexure height (I) is chosen according to equation [2] to insure that the heat flux from the portion of the flexure plate that surrounds the beam source mount is small compared to that developed by the beam source. (The foldback flexure height in general should be at least 5 times greater than the largest flexure thickness ($t_2$)). The thermal capacity requirements of the thermal element 40 are determined using equation [3]. The thermal time constant T is determined for the final design using equation [4]. The passive response to the temperature perturbations in the assembly is controlled by this time constant and is dependent on the requirements set for the electronic control of the thermal element 40.

Accordingly, $$(r_2^2 - r_1^2) = (r_4^2 - r_3^2) \quad [1]$$

$$\frac{L}{r_2^2} \leq \frac{1}{10} \left[ \frac{I}{r_2^2 - r_1^2 + r_4^2 - r_3^2} + \frac{1}{2} \left( \frac{\ln(r_4/r_1)}{t_1} + t \frac{\ln(r_5/r_3)}{t_2} \right) \right] \quad [2]$$

$$Q_{TEC} \geq \quad [3]$$

$$\left[ \frac{\pi}{T}(r_2^2 - r_1^2 + r_4^2 - r_3^2) + 2\pi \left( \frac{t_1}{\ln(r_4/r_1)} + \frac{t_2}{\ln(r_5/r_3)} \right) \right] k$$

where:
$Q_{TEC} <$ = heat capacity (Watts) of the thermal element
$k$ = beam source mount material thermal conductivity (W/cm° C.)
$i_o$ = beam source drive current (Amps)
$v_o$ = beam source drive voltage (Volts)
$T_o$ = desired beam source temperature (° C.)
$T_A$ = maximum ambient temperature (° C.)
and, $$T = \frac{L^2 \rho C_p}{k} \quad [4]$$

where:
T = thermal time constant of the beam source mount
$C_P$ = specific heat of the beam source mount
$\rho$ = mass density of the beam source mount As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

What is claimed is:

1. Athermalized optical assembly for providing athermalized collimation of a light beam from a beam source, comprising:
   a flexure plate including:
      a) beam source mount for fixing the beam source at a predetermined interface and for thereby defining a light beam optical axis, and
      b) a kinematic hinge in the form of a circular foldback flexure located radially adjacent the beam source mount;
   beam collimating means;
   beam collimating means support attached to the flexure plate for receiving the beam collimating means and for aligning the collimating means on the optical axis, and
   a thermal element operatively connected to the flexure plate, the thermal element having a selected thermal response and being located with respect to the beam source mount so as to maintain the temperature of the beam source, wherein the kinematic hinge is thereby operated to select the back focal length of the assembly while maintaining the radial alignment of the beam source and beam collimating means, and to minimize the mechanical strain at the interface between the beam source and the beam source mount.

2. The apparatus of claim 1, wherein the beam source mount, circular foldback flexure, and flexure plate are integrally formed.

3. The apparatus of claim 2, wherein the beam source mount and circular foldback flexure are preferably composed of the same material.

4. The apparatus of claim 1, wherein the material forming the beam source mount and circular foldback flexure is substantially similar in composition and CTE to the material forming the portion of the beam source that is attached to the beam source mount.

5. The apparatus of claim 1, wherein the beam source mount, circular foldback flexure, and flexure plate are cold formed in one operation.

6. The apparatus of claim 1, wherein the circular foldback flexure is situated immediately adjacent to the outermost radius of the beam source mount.

7. The apparatus of claim 1, wherein the circular foldback flexure includes first and second spaced flexure sections each having a stiffness that is sufficiently less than the stiffness of the bulk material in the remainder of the flexure plate to confine a kinematic bending moment primarily at the circular foldback flexure.

8. The apparatus of claim 7, wherein the thermal gradient across each flexure section is sufficiently similar such that substantially equal thermal strains occur at each sections.

9. The apparatus of claim 1, wherein the beam source mount has length L and radius r selected according to a predetermined aspect ratio (L/r) and according to the maximum temperature difference between the ambient temperature ($T_A$) and the beam source temperature ($T_D$), said aspect ratio being sufficient to decrease the mechanical strain at the interface of the beam source mount and the beam source.

10. The apparatus of claim 1, wherein the thermal element is attached to the back surface of the beam source mount.

11. The apparatus of claim 1, wherein the beam source mount includes the light beam source.

12. The apparatus of claim 11, wherein the beam source further comprises a semiconductor laser diode.

13. The apparatus of claim 1, wherein the thermal element further comprises means for dissipating heat from the beam source.

14. The apparatus of claim 13, wherein the heat dissipation means further comprises a thermoelectric cooler.

15. The apparatus of claim 13, wherein the heat dissipation means further comprises a passive heat sink.

16. Athermalized optical assembly for providing athermalized collimation of a laser beam, comprising:

a flexure plate including:
 a) beam source mount having fixed thereon a beam source in the form of a laser diode at a predetermined interface for thereby defining a light beam optical axis, and
 b) a kinematic hinge in the form of a circular foldback flexure located immediately adjacent the outermost radius of the beam source mount;

beam collimating lens support, attached to the flexure plate, including a beam collimating lens for aligning the collimating lens at a predetermined position on the optical axis, and thermal element operatively connected to the flexure plate, the thermal element having a selected thermal response and being located with respect to the beam source mount so as to maintain the temperature of the beam source and operate the kinematic hinge to thereby select the back focal length of the assembly while maintaining the radial alignment of the beam source and minimizing the mechanical strain at the interface between the beam source and the beam source mount.

* * * * *